United States Patent
Yin et al.

(10) Patent No.: US 8,420,489 B2
(45) Date of Patent: Apr. 16, 2013

(54) HIGH-PERFORMANCE SEMICONDUCTOR DEVICE AND METHOD OF MANUFACTURING THE SAME

(75) Inventors: Haizhou Yin, Poughkeepsie, NY (US);
Huilong Zhu, Poughkeepsie, NY (US);
Zhijiong Luo, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 308 days.

(21) Appl. No.: 12/996,809

(22) PCT Filed: Jun. 25, 2010

(86) PCT No.: PCT/CN2010/074462
§ 371 (c)(1),
(2), (4) Date: Dec. 8, 2010

(87) PCT Pub. No.: WO2011/075991
PCT Pub. Date: Jun. 30, 2011

(65) Prior Publication Data
US 2011/0248358 A1    Oct. 13, 2011

(30) Foreign Application Priority Data
Dec. 23, 2009 (CN) .......................... 2009 1 0243851

(51) Int. Cl.
*H01L 21/336* (2006.01)

(52) U.S. Cl.
USPC .................... 438/289; 438/919; 257/E21.409

(58) Field of Classification Search ................ 438/289, 438/919; 257/403, E21.409, E29.242
See application file for complete search history.

(56) References Cited

U.S. PATENT DOCUMENTS
2006/0255375 A1 * 11/2006 Dokumaci et al. ............ 257/270
2007/0054480 A1 * 3/2007 Zhu et al. ...................... 438/510

* cited by examiner

*Primary Examiner* — Chuong A Luu
*Assistant Examiner* — Nga Doan
(74) *Attorney, Agent, or Firm* — Troutman Sanders LLP

(57) ABSTRACT

A method of manufacturing a semiconductor device, wherein thermal annealing of the source/drain regions is performed before reverse Halo implantation to form a reverse Halo implantation region. The method comprises: removing the dummy gate to expose the gate dielectric layer, so as to form an opening; performing reverse Halo implantation on the substrate via the opening, so as to form a reverse Halo implantation region in the channel of the device; activating the dopants in the reverse Halo implantation region by annealing; and performing subsequent device processing. Deterioration of the gate stack due to the reverse Halo ions implantation may be avoided by the present invention, such that the reverse Halo ions implantation may be applied to the device with a metal gate stack, and the short channel effects may be alleviated and controlled, thereby the performance of the device is enhanced.

18 Claims, 10 Drawing Sheets

HIGH-PERFORMANCE SEMICONDUCTOR DEVICE AND METHOD OF MANUFACTURING THE SAME

BENEFIT CLAIMS

This application is a US National Stage of International Application No. PCT/CN2010/074462, filed Jun. 25, 2010, which claims the benefit of CN 200910243851.8, filed Dec. 23, 2009.

FIELD OF THE INVENTION

The present invention generally relates to a semiconductor device and a method of manufacturing the same. More specifically, it relates to a semiconductor device having a reverse Halo implantation region in a channel and a method of manufacturing the same, to thereby alleviate the short channel effects (SCE) to without deteriorating the performance of the metal gate stack.

BACKGROUND OF THE INVENTION

With the development of the semiconductor industry, integrated circuits with higher performance and more powerful functions require greater element density. Thus, the sizes of the components need to be scaled further. Accordingly, in order to improve the performance of the Metal Oxide Semiconductor Field Effect Transistor (MOSFET), the gate length of the MOSFET should be further reduced. However, with the continuous reduction of the gate length, when the gate length is reduced to approach the width of the depletion layer of the source and the drain, for example less than 40 nm, severe short channel effects occur, which disadvantageously leads to deterioration of device performance and difficulty for large scale production of integrated circuit. One of the short channel effects is that the threshold voltage of MOSFET decreases with the reduction of the gate length, thereby rendering a rapid increase of leakage current when the gate length is short. It has become a challenge in large scale production of integrated circuits to alleviate the short channel effects and effectively control the low threshold voltage caused by the decrease of the gate length.

A method for controlling and alleviating the short channel effects by introducing reverse Halo implantation region in a channel is depicted in the paper by Zhu H et al., On the Control of Short-Channel Effect for MOSFETs With Reverse Halo Implantation, IEEE ELECTRON DEVICE LETTERS, vol. 28, No. 2, pages 168-170, 2007. By implanting n-type dopants using high energy in the channel of NMOS devices, the amount of the n-type dopants in the channel region of NMOS devices with shorter gate length is less than that of the n-type dopants in the channel region of NMOS devices with longer gate length because gate stack with longer gate length will block more implanted dopants, thus the threshold voltage of NMOS devices with shorter gate length may be higher, and the short channel effects may be alleviated. Such a method may also be performed on the PMOS devices by implanting p-type dopants using high energy.

However, all the existing reverse Halo implantation methods are performed after formation of the gate stack. Furthermore, the reverse Halo dopants should penetrate through the gate stack to reach the channel region, which may disadvantageously lead to deterioration of the gate stack and cause gate leakage current. Moreover, by using metal gate, it is difficult for the reverse Halo dopants to penetrate through the metal gate, which will cause failure of reverse Halo implantation.

Therefore, for the purpose of improving the manufacture of high-performance semiconductor device, there is a need to provide a semiconductor device capable of forming a reverse Halo implantation region in a channel and a method of manufacturing the same, to thereby alleviate the short channel effects without deteriorating the performance of the metal grate stack.

SUMMARY OF THE INVENTION

To solve the above problem, a method for manufacturing a semiconductor device is provided in the present invention. The method comprises: a) providing a substrate; b) forming a source region, a drain region, a gate stack, sidewall spacers and an interlayer dielectric layer on the substrate, wherein the gate stack is disposed between the source region and the drain region on the substrate, the sidewall spacers are formed on the side surfaces of the gate stack, the interlayer dielectric layer covers the source region and the drain region, and the gate stack comprises a gate dielectric layer and a dummy gate, and; c) removing the dummy gate to expose the gate dielectric layer, so as to form an opening; d) performing reverse Halo implantation to the device to form a reverse Halo implantation region on the substrate via the opening, wherein for a n-type semiconductor device, the implantation dopants are n-type, and for a p-type semiconductor device, the implantation dopants are p-type; e) activating the dopants in the reverse Halo implantation region by annealing; f) performing subsequent device processes.

In addition, the following alternative method may be used to manufacture the semiconductor device. The method comprises: a) providing a substrate; b) forming a source region, a drain region, a gate stack, sidewall spacers and an interlayer dielectric layer on the substrate, wherein the gate stack is disposed between the source region and the drain region on the substrate, the sidewall spacers are formed on the side surfaces of the gate stack, the interlayer dielectric layer covers the source region and the drain region, and the gate stack comprises a gate dielectric layer and a dummy gate; c) removing the gate dielectric layer and the dummy gate to expose the substrate, so as to form an opening; d) performing reverse Halo implantation to the device to form a reverse Halo implantation region on the substrate via the opening, wherein for a n-type semiconductor device, the implantation dopants are n-type, and for a p-type semiconductor device, the implantation dopants are p-type; e) activating the dopants in the reverse Halo implantation region by annealing; f) performing subsequent device processing.

In particular, for an n-type semiconductor device, the implantation dopants are, for example, Group-V elements, such as phosphorus and arsenic, the implantation energy is in the range of 5-40 keV, and the implantation dose is 1e12-5e13. For a p-type semiconductor device, the implantation dopants are, for example, Group-III elements, such as B, $BF_2$ and In, the implantation energy is in the range of 5-40 keV and the implantation dose is 1e12-5e13. Two symmetric reverse Halo implantations may be performed to the device at an angle of about 0-40 degree to the vertical direction so as to form a reverse Halo implantation region in the channel of the substrate.

In addition, in accordance with another aspect of the present invention, there is provided a semiconductor device, comprising: a substrate, a source region, a drain region, a gate stack, sidewall spacers and an interlayer dielectric layer on the substrate, wherein the gate stack is disposed between the source region and the drain region on the substrate, the sidewall spacers are formed on the side surfaces of the gate stack, the interlayer dielectric layer covers the source region and the drain region, and the gate stack comprises a gate dielectric layer and a metal gate, and the semiconductor device further comprising: a reverse Halo implantation region formed in the channel region of the semiconductor device, wherein for an n-type semiconductor device, the reverse Halo implantation region has n-type dopants, and for a p-type semiconductor device, the reverse Halo implantation region has p-type dopants.

DETAILED DESCRIPTION

The present invention generally relates to a method of manufacturing a semiconductor device. The following disclosure provides a plurality of different embodiments or examples to achieve different structures of the semiconductor device according to the present invention. To simplify the disclosure of the present invention, description of the components and arrangements of specific examples is given below. Of course, they are only illustrative and not limiting the present invention. Moreover, in the present invention, reference numbers and/or letters may be repeated in different embodiments. Such repetition is for the purposes of simplification and clearness, and does not denote the relationship between respective embodiments and/or arrangements being discussed. In addition, the present invention provides various examples for specific process and materials. However, it is obvious for a person of ordinary skill in the art that other process and/or materials may alternatively be utilized. Furthermore, the following structure in which a first object is "on" a second object may include an embodiment in which the first object and the second object are formed to be in direct contact with each other, and may also include an embodiment in which another object is formed between the first object and the second object such that the first and second objects might not be in direct contact with each other.

First Embodiment

Figure 1:
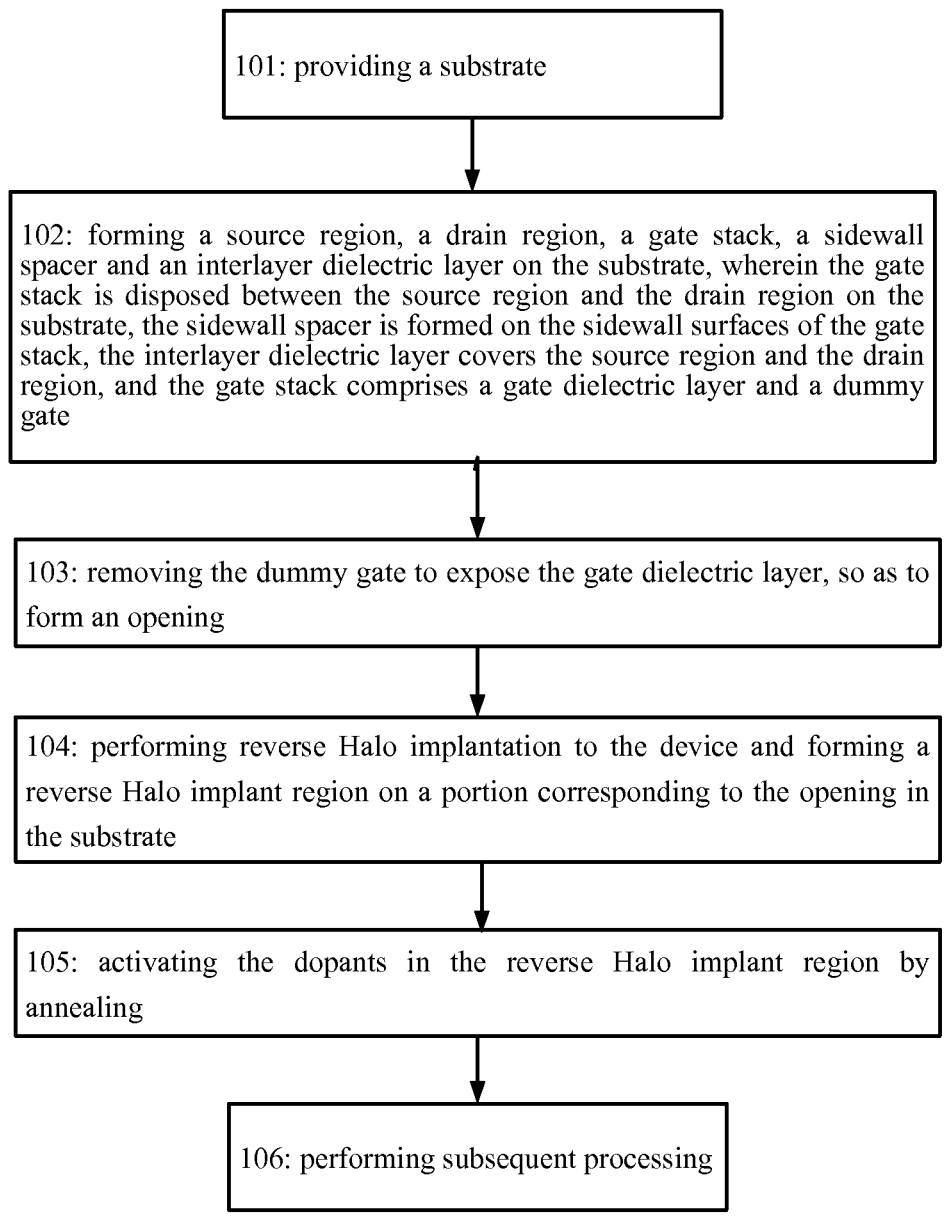
FIG. 1 is a flowchart illustrating a method of manufacturing a semiconductor device according to the first embodiment of the present invention.
Figure 2:
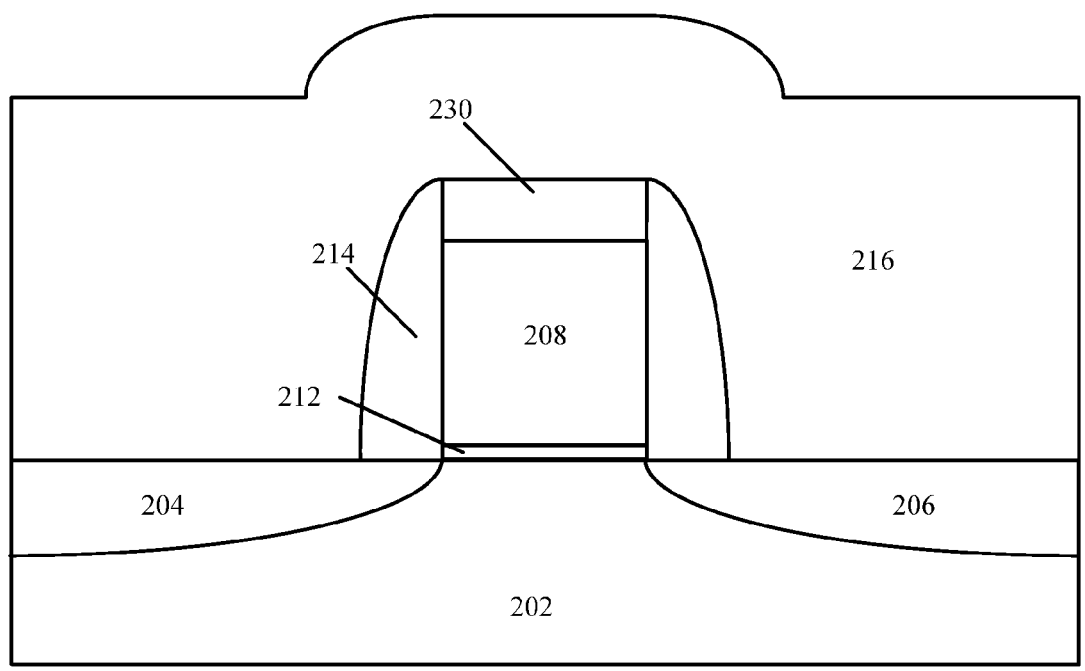
FIGS. 2-11 are structural diagrams illustrating the stages for manufacturing a semiconductor device according to the first embodiment of the present invention.

According to the first embodiment of the present invention, as shown in FIG. 1, FIG. 1 is a flowchart illustrating a method of manufacturing a semiconductor device according to the first embodiment of the present invention. In step 101, a semiconductor substrate 202 is first provided, as shown in FIG. 2. In this embodiment, the substrate 202 includes a crystalline silicon substrate (e.g., a wafer). According to the design specifications known in the prior art (e.g., a p-type substrate or an n-type substrate), the substrate 202 may have various doping configurations. Other examples of the substrate 202 may include other semiconductors, e.g., germanium and diamond. The substrate 202 may also include compound semiconductors, e.g., SiC, GaAs, InAs or InP. In addition, the substrate 202 may optionally include an epitaxial layer that may be under stress to enhance the performance, and/or may include a Silicon-On-Insulator (SOI) structure.

In step 102, a source region 204, a drain region 206, a gate stack 30 and sidewall spacers 214 are formed on the substrate 202, wherein the gate stack 30 is disposed between the source region 204 and the drain region 206 on the substrate 202, and the sidewall spacers 214 is formed on the side surfaces of the gate stack 30. The gate stack 30 includes a gate dielectric layer 212 and a dummy gate 208.

The gate dielectric layer 212 may be silicon dioxide, silicon nitride, or high-k dielectrics. The dummy gate 208 is a sacrificial layer. The dummy gate 208 may be made of, for example, polysilicon. In one embodiment, the materials for the dummy gate 208 may include amorphous silicon. Optionally, a cap layer 230 may be formed on the dummy gate 208. For example, the cap layer 230 may be formed of silicon nitride or silicon dioxide. The gate dielectric layer 212 and dummy gate 208 may be formed by MOS process, such as depositing, lithography, etching, and/or other appropriate methods.

The source region 204 and drain region 206 may be formed by implanting, depending on desired transistor structure, p-type or n-type dopants into the substrate 202. The source region 204 and drain region 206 may be formed by a method including lithography, ion implantation, diffusion and/or other process as appropriate. The source region 204 and drain region 206 may be formed after the formation of the gate dielectric layer 212. By using conventional semiconductor process, the device is annealed to activate the dopants in the source 204 and drain 206, wherein the annealing may be performed by the processes of rapid thermal annealing, spike annealing, etc., which are known to a person skilled in the art.

The sidewall spacers 214 are formed on the side surfaces of the gate stack 30. The sidewall spacers 214 may be formed of silicon nitride, silicon dioxide, silicon oxynitride, silicon carbide, fluorine-doped silicate glass, low-k dielectric materials, and/or other materials as appropriate and any combination thereof. The sidewall spacers 214 may be made of the same or different materials as the cap layer 230. The sidewall spacers 214 may be a multilayer structure. The sidewall spacers 214 may be formed by appropriate methods, including depositing appropriate dielectric materials, and may be achieved by using the technique known to a person skilled in the art.

In particular, an interlayer dielectric layer (ILD) 216 may be formed by deposition on the substrate, the interlayer dielectric layer 216 may be, but not limited to, e.g., undoped silicon oxide ($SiO_2$), doped $SiO_2$ (, borosilicate glass, boron-phosphorosilicate glass) and silicon nitride ($Si_3N_4$). The interlayer dielectric layer 216 may be formed by, for example, Chemical Vapor Deposition (CVD), Physical Vapor Deposition (PVD), Atomic Layer Deposition (ALD) and/or other process as appropriate. The interlayer dielectric layer 216 may be a multilayer structure. In one embodiment, the interlayer dielectric layer 216 has a thickness ranging from about 30 nm to 90 nm.

Figure 3:
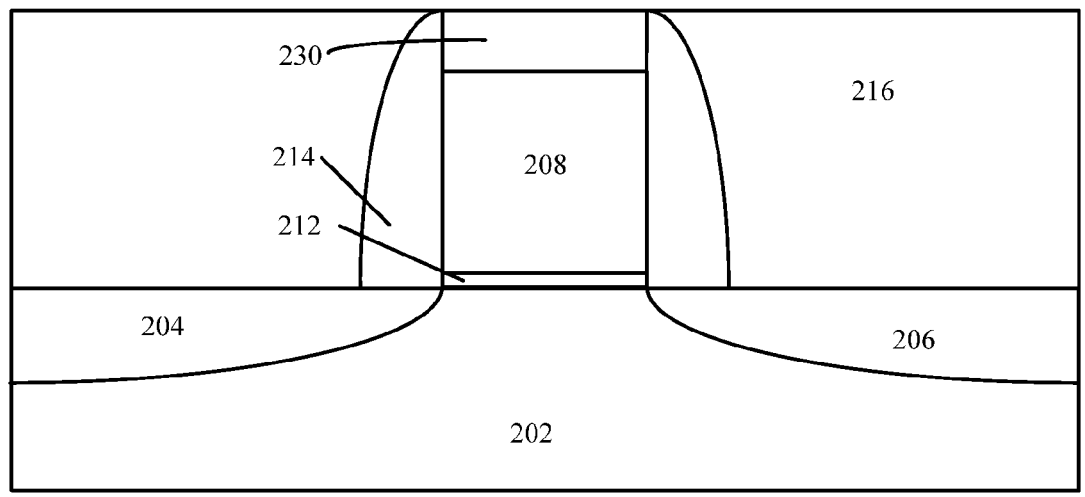
Figure 4:
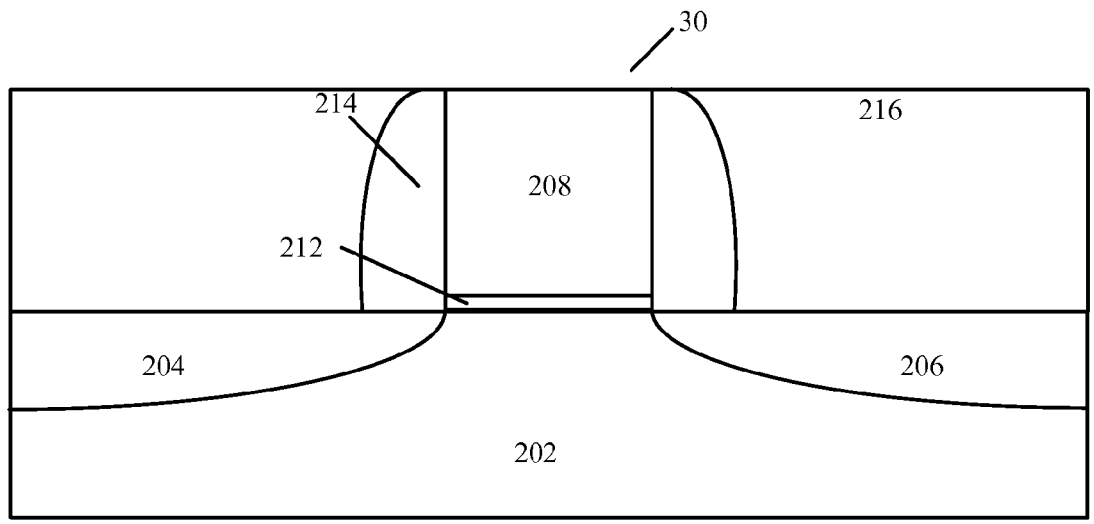

Then, a planarization process is performed on the interlayer dielectric layer 216 and the cap layer 230 to expose the upper surface of the dummy gate 208. As shown in FIG. 3, the interlayer dielectric layer 216 and the cap layer 230 may be removed by, for example, a method of Chemical-Mechanical Polishing (CMP) or reactive ion etching until the dummy gate 208 is exposed, and a structure as illustrated in FIG. 4 is achieved.

Figure 5:
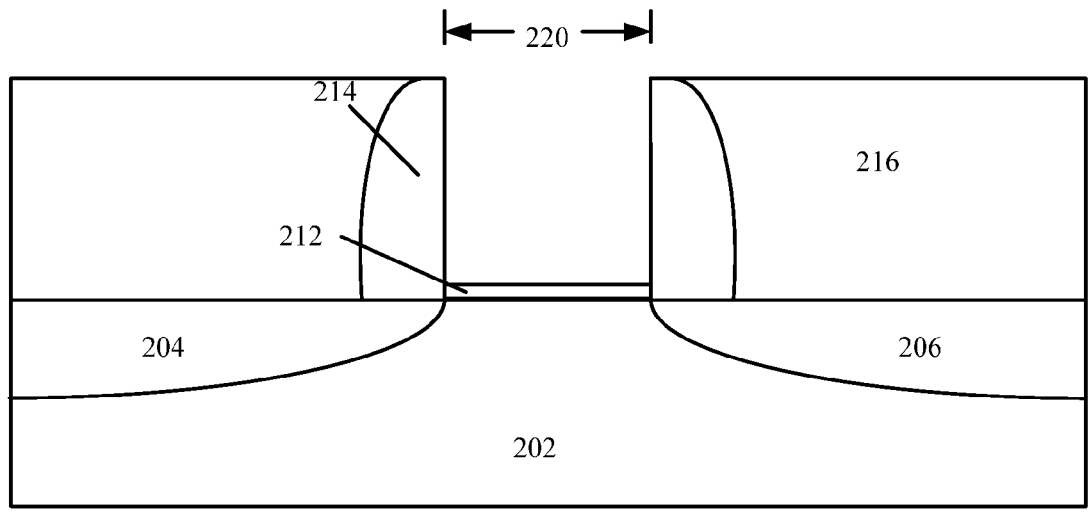

The flow then goes to step 103, in which the dummy gate 208 is removed to thereby expose the gate dielectric layer 212 to form an opening 220, as illustrated in FIG. 5. For example, by selectively etching polysilicon to the gate dielectric layer 212, the dummy gate structure 208 is removed and the opening 220 is formed. The dummy gate 208 may be removed by using wet etching and/or dry etching. In one embodiment, the wet etching process may include chemicals such as tetramethylammonium hydroxide (TMAH), KOH or other etchant solutions as appropriate.

Figure 6A:
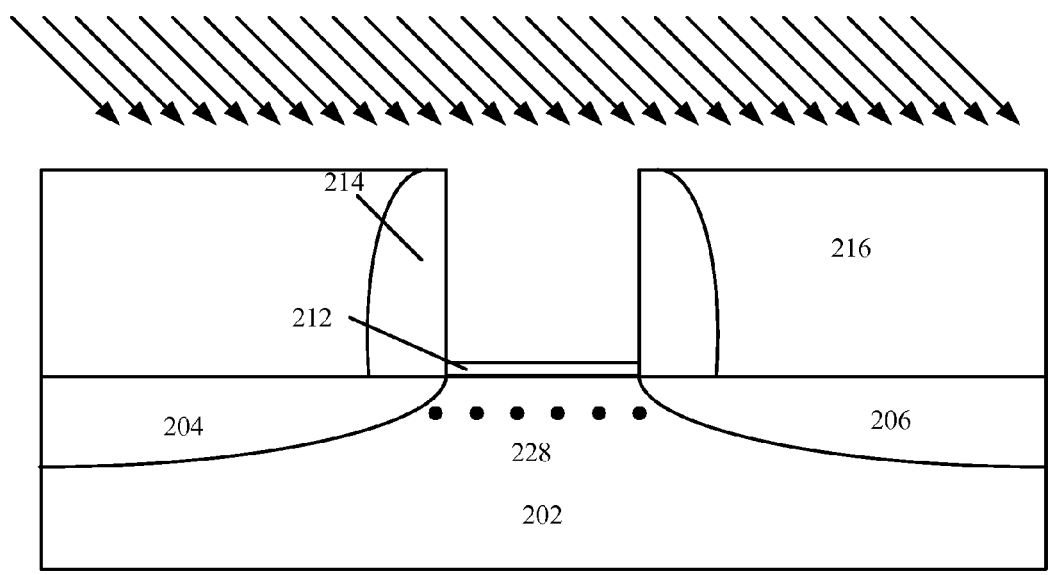

In step 104, a reverse Halo implantation is performed on the structure as shown in FIG. 5 to form a reverse Halo implantation region on the substrate via the opening, as illustrated in FIG. 6A.

The reverse Halo implantation of the present invention is defined as follows: for the n-type semiconductor device, the n-type dopants implantation is performed, for example, by using Group-V elements, such as phosphorus and arsenic, the implantation energy is in the range of 5-40 keV, and the implantation dose is 1e12-5e13; and for the p-type semiconductor device, the p-type dopants implantation is performed, for example, by using Group-III elements, such as B, $BF_2$ and In, the implantation energy is in the range of 5-40 keV, and the implantation dose is 1e12-5e13. Because the reverse Halo ions in the present invention are implanted via the opening 220, the implantation energy required in the present invention is much lower than that of the reverse Halo implantation in the prior art. In the present invention, two symmetric reverse Halo implantations may be performed to the device at an angle of about 0-40 degree to the vertical direction so as to form a reverse Halo implantation region 228 in the channel of the substrate. The reverse Halo implantation region is determined by the width of the opening 220, the height of the opening 220, the energy and angle of ion implantation and the ability of ions to penetrate through the sidewall spacers 214 and the dielectric layer 216. As the angle to the vertical direction increases, the reverse Halo implantation region will move from the middle of the channel to both sides of the channel, and the depth of the reverse Halo implantation region decreases as well. Therefore, the energy and angle of the reverse Halo implantation are designed to control the short channel effects of the device in practice. Supposing that the two symmetric reverse Halo implantations are performed at a relative small angle to the vertical direction, the two reverse Halo implantation regions in the channel are so close to the middle of the channel to possibly overlap each other.

Figure 6B:
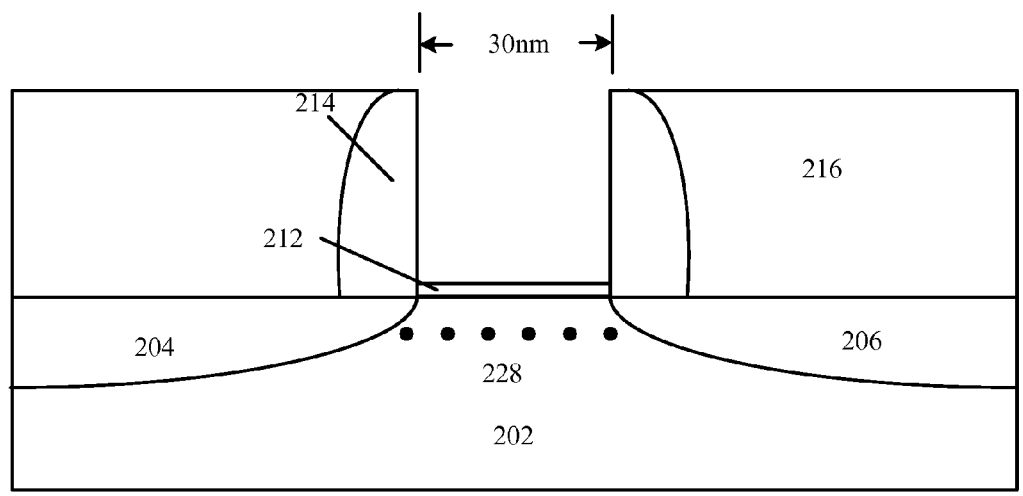
Figure 6C:
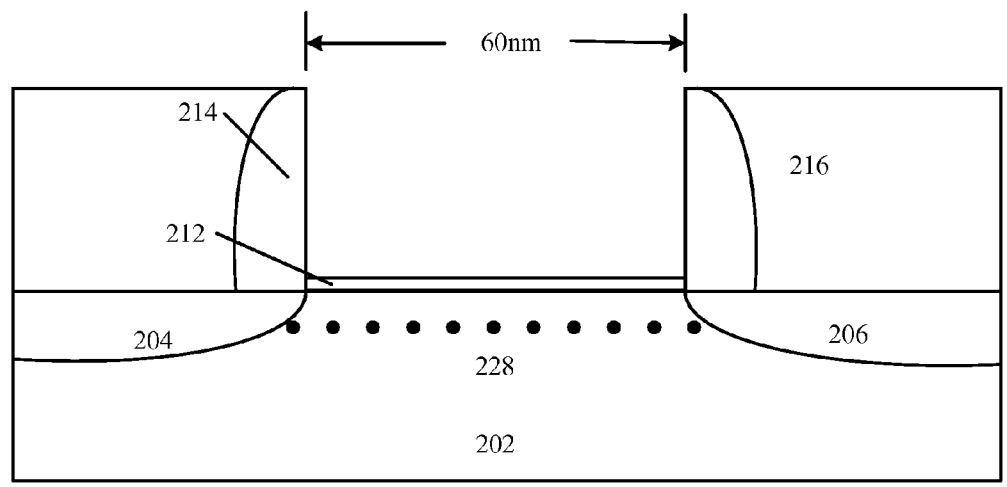

Since the size of the gate length determines the width of the opening 220, which in turn determines the amount of the implanted reverse Halo ion dopants, the amount of the implanted reverse Halo ion dopants decreases with the reduction of the gate length, and vice versa. Hence, the counteraction by the n-type reverse Halo ion dopants to the p-type dopants in the channel region in the short channel nMOSFET is less than that in the long channel nMOSFET, while the counteraction by the p-type reverse Halo ion dopants to the n-type dopants in the channel region in the short channel pMOSFET is less than that in the long channel pMOSFET. Therefore, the amount of the doped reverse Halo ions in the channel region of the short channel MOSFET device is less than that in the long channel MOSFET device. As a result, the threshold voltage of the short channel device may be increased to alleviate the low threshold voltage effect caused by the reduction of the gate length, and thereby alleviate the short channel effects. For example, as illustrated in FIGS. 6B-6C, the amount of the doped reverse Halo ions in the nMOSFET device with the gate length of 30 nm (FIG. 6B) will be much less than that in the nMOSFET device with the gate length of 60 nm (FIG. 6C).

Then, in step 105, the device is annealed to activate the dopants in the reverse Halo implantation region. For example, rapid thermal annealing may be used, and other annealing process may be used in other embodiments. At this step, the requirements for the activation of the dopants in the source/drain regions and the extensions as well as the effect of diffusion should be further taken into account. If the dopants in the source/drain regions and the extensions have not been activated, this step may also be used for the purpose of annealing to activate the dopants. According to the embodiment of the present invention, spike annealing process is typically used to anneal the device, e.g., an annealing between 0.5 to 2 seconds at a temperature of above 1000° C.

Figure 7:
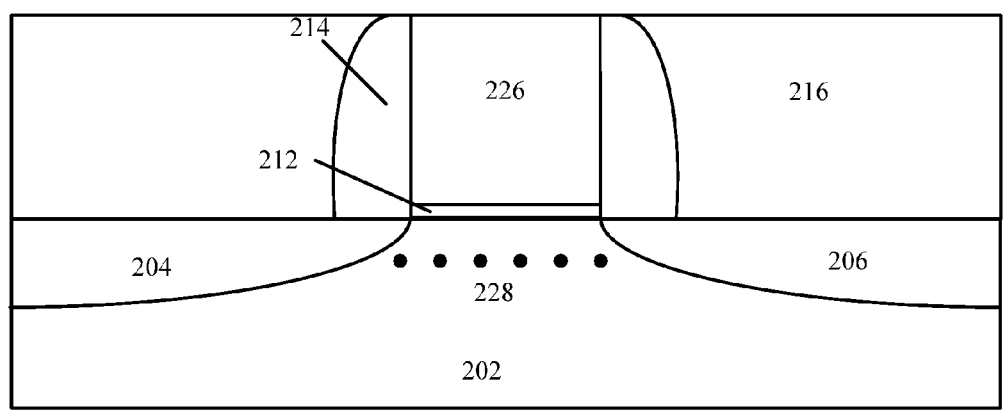

Then, in step 106, a further processing may be performed to the device according to the requirements of manufacture. For example, a metal gate 226 may be formed in the opening as illustrated in FIG. 7. Preferably, after a gate dielectric layer 212 is formed, a work function metal gate layer may be deposited thereon. The work function metal gate layer may have a thickness in the range from about 10 Å about 100 Å. The materials for the work function metal gate layer may include TiN, TiAlN, TaN, TaAlN and any combination thereof.

And then, a metal gate 226 is formed on the gate dielectric layer 212, as illustrated in FIG. 7. The structure of the metal gate 226 may include one or more material layers, such as a liner, a material layer for providing suitable work function to the gate, a gate material layer and/or other material layers as appropriate. For an n-type semiconductor device, one or more materials for deposition may be selected from a group comprising TiN, TiAlN, TaAlN, TaN, TaSiN and any combination thereof; and for a p-type semiconductor device, one or more materials for deposition may be selected from a group comprising TiN, TiSiN, TiCN, TaAlC, TiAlN, TaN and any combination thereof.

Finally, the Chemical-Mechanical Polishing (CMP) process is performed to form a metal gate 226.

Figure 8:
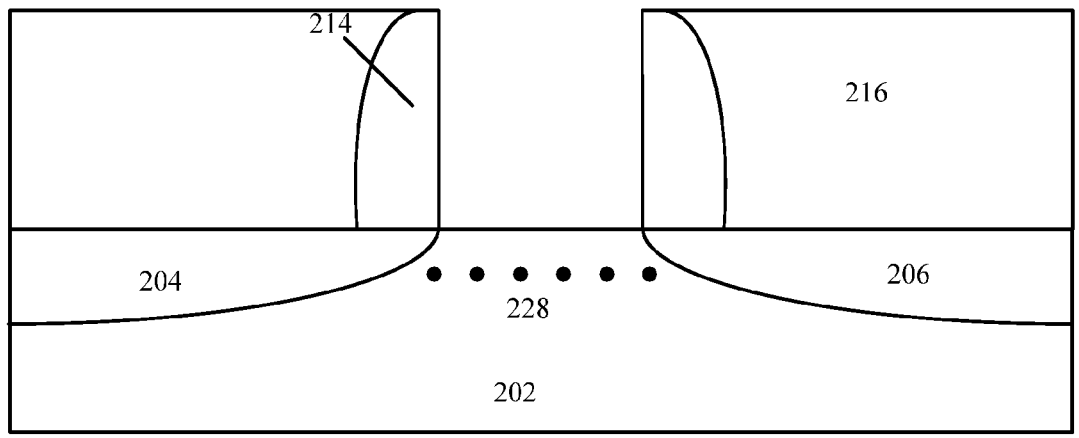

In particular, unacceptable deterioration of the gate dielectric layer may be caused by the reverse Halo implantation and the thermal annealing process of the reverse Halo implantation. Alternatively, as illustrated in FIG. 8, after the reverse Halo ions implantation, the gate dielectric layer 212 may be removed, for example, by using wet etching and/or dry etching. In one embodiment, the chemicals, such as hydrofluoric acid (HF) or other suitable etchant solutions, may be used in the wet etching process. Then, a new gate dielectric layer is formed. The gate dielectric layer 212 may be removed after the reverse Halo ions implantation. In other embodiments, the gate dielectric layer 212 may also be removed after the subsequent annealing of the reverse Halo implantation region.

In a case where the dielectric layer 212 is removed, a new gate dielectric layer 224 and a metal gate 226 may be formed in the opening after the annealing of the reverse Halo implantation region, wherein the gate dielectric layer 224 covers the interlayer dielectric layer 216, the portion of the substrate 202 in the opening 220, and the inner surfaces of the sidewall spacers 214.

Figure 9:
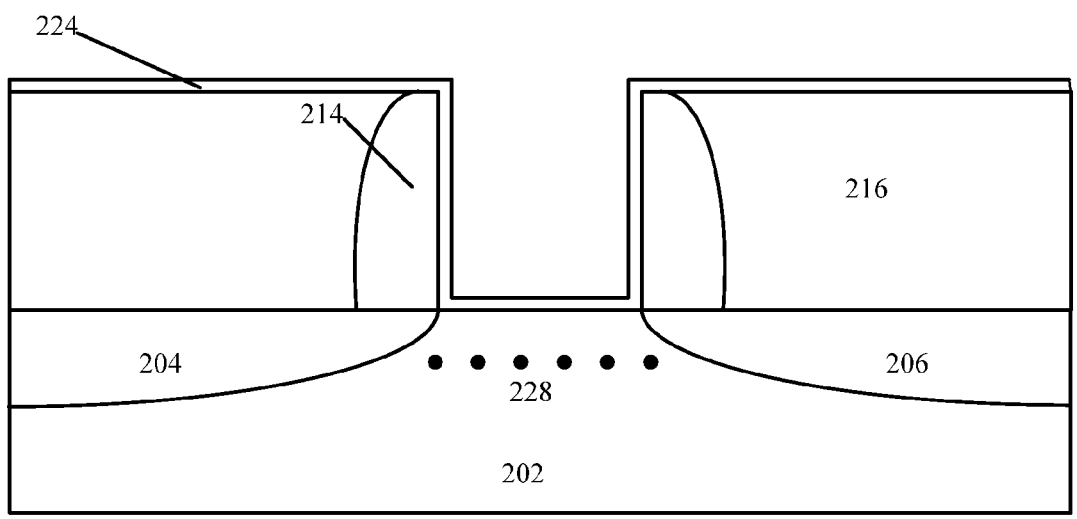

As illustrated in FIG. 9, a new gate dielectric layer 224 may be deposited so as to cover the interlayer dielectric layer 216, the portion of the substrate in the opening 220, and the inner surfaces of the sidewall spacers. The gate dielectric layer 224 is made of high dielectric constant (high k) materials. In one embodiment, the high k materials include hafnium oxide ($HfO_2$). Other examples of the high k materials include HfSiO, HfSiON, HfTaO, HfTiO, HfZrO and other suitable materials, and any combination thereof. The gate dielectric layer 224 may have a thickness in the range from about 12 Å to 35 Å. The gate dielectric layer 212 may be formed by a process such as CVD or ALD. The gate dielectric layer 224 may be a multilayer structure, including more than one layer having the above materials.

Preferably, after a gate dielectric layer 224 is formed, a work function metal gate layer may be deposited thereon. The work function metal gate layer may have a thickness in the range from about 10 Å about 100 Å. The materials for the work function metal gate layer may include TiN, TiAlN, TaN and TaAlN.

Preferably, after the new gate dielectric layer 224 is formed, an additional annealing process may be performed, so as to improve the quality of the gate dielectric layer 224, wherein the temperature of the annealing is in the range of 600° C. to 800° C.

Figure 10:
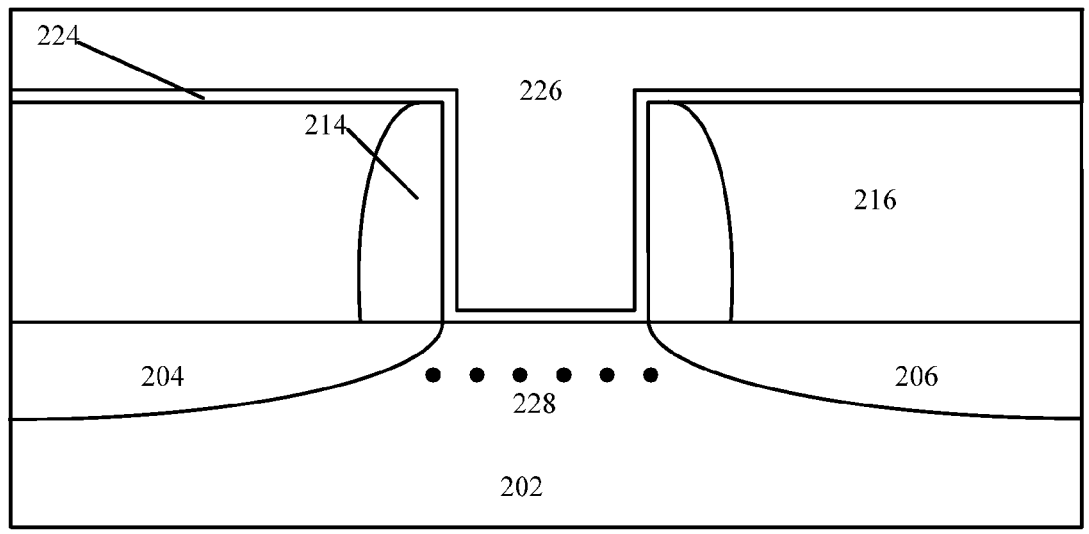

Then, a metal gate 226 is formed on the gate dielectric layer 224, as illustrated in FIG. 10. The structure of the metal gate 226 may include one or more material layers, such as a liner, a material layer for providing suitable work function to the gate, a gate material layer and/or other material layers as appropriate. For an n-type semiconductor device, one or more materials for deposition may be selected from a group comprising TiN, TiAlN, TaAlN, TaN, TaSiN and any combination thereof; and for a p-type semiconductor device, one or more materials for deposition may be selected from a group comprising TiN, TiSiN, TiCN, TaAlC, TiAlN, TaN and any combination thereof.

Figure 11:
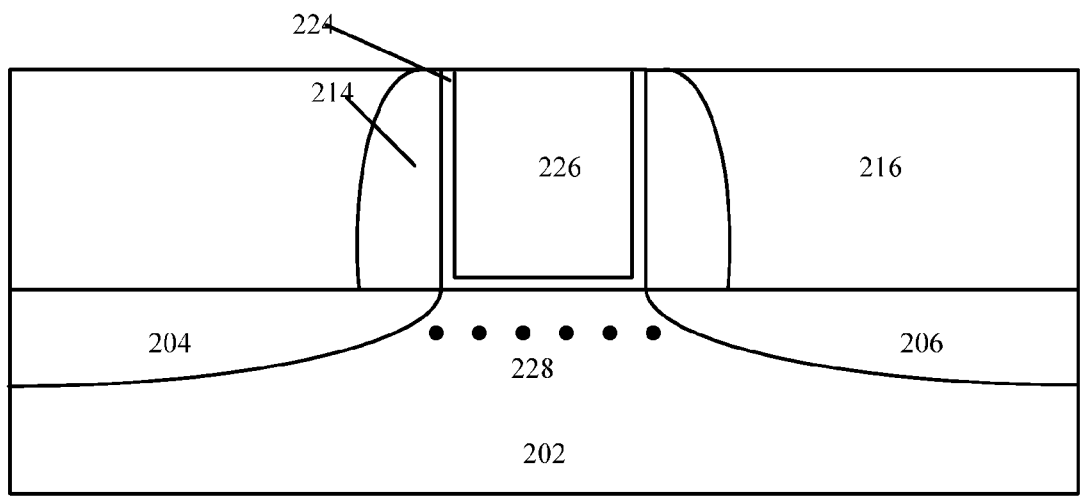

Finally, a metal gate 226 is formed by performing the CMP process, as illustrated in FIG. 11.

If the gate dielectric is not greatly influenced by the reverse Halo implantation and the thermal annealing process of the reverse Halo implantation, the gate dielectric in the first embodiment may function as the gate dielectric of the device, and thus the gate dielectric layer of the device may be retained, that is, the gate dielectric is not removed. The metal gate is formed after performing the annealing for activation, and thus no gate dielectric layer is formed on the side surfaces of the sidewall spacers 214. If the influence on gate dielectric by the reverse Halo implantation and the thermal annealing process of the reverse Halo implantation becomes unacceptable, such as the reliability of the device is influenced, the gate dielectric layer 212 may be removed before or after the annealing of the reverse Halo implantation region. Then a new gate dielectric layer and a metal gate are formed after annealing of the device, and thus a gate dielectric layer is formed on the side surfaces of the sidewall spacers 214.

Second Embodiment

Figure 12:
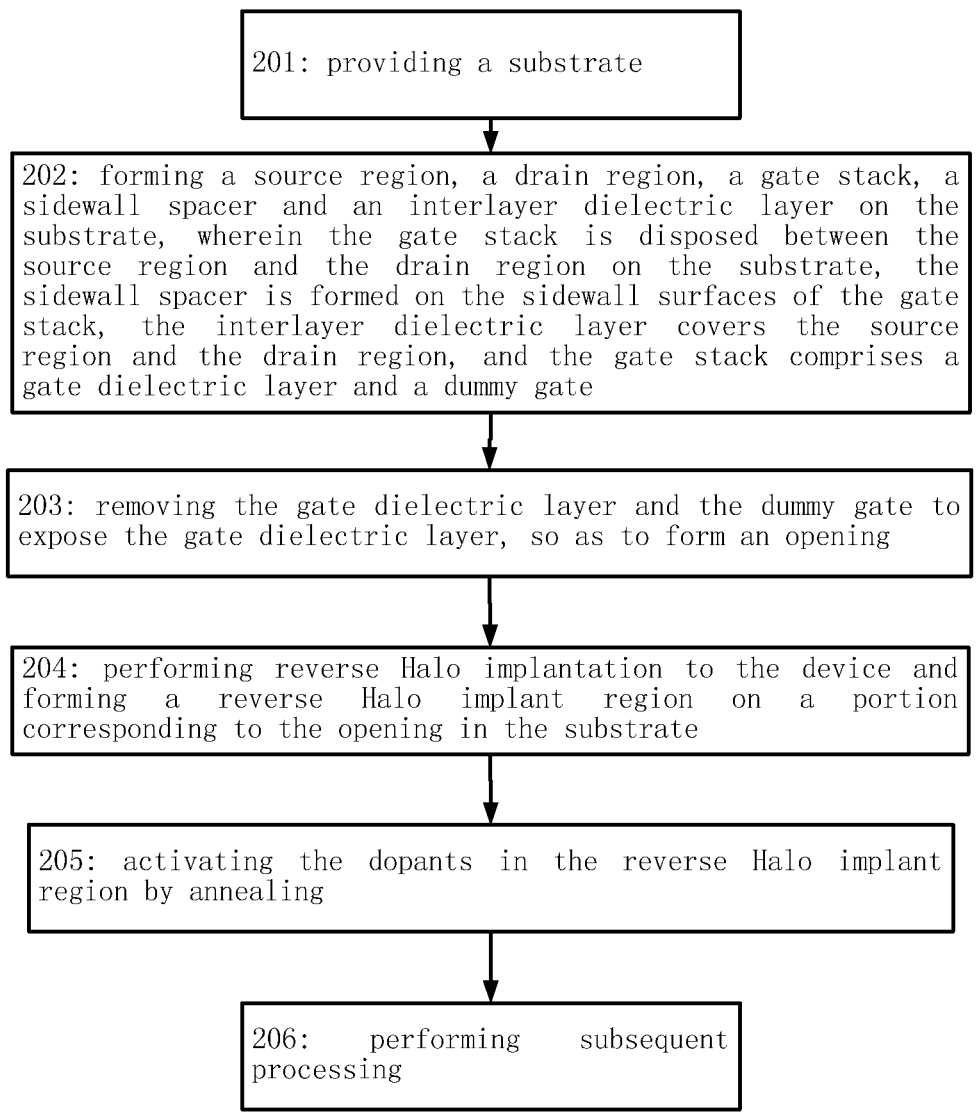
FIG. 12 a flowchart illustrating a method for manufacturing a semiconductor device according to the second embodiment of the present invention.
Figure 13:
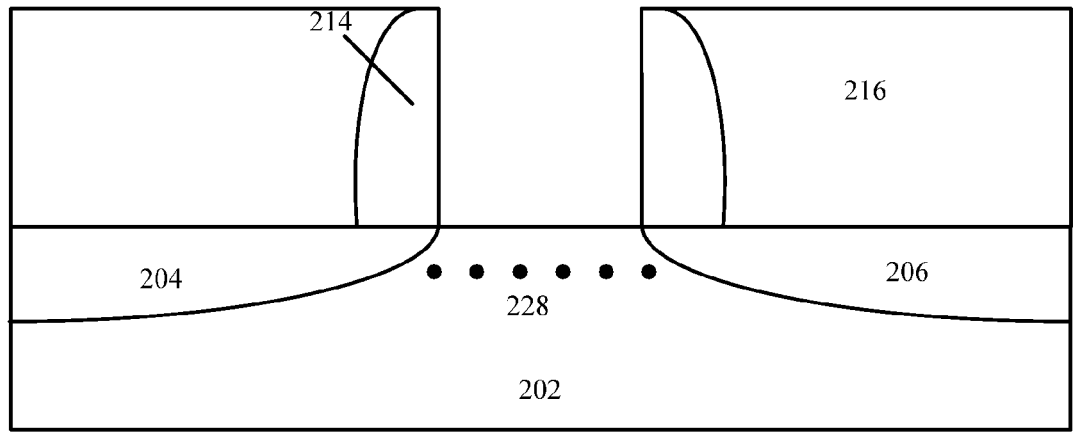
FIGS. 13-15 are structural diagrams illustrating the stages for manufacturing a semiconductor device according to the second embodiment of the present invention.

It will be set forth hereinafter only for the aspects that the second embodiment distinguishes from the first embodiment. The parts that are not described should be construed as being formed by the same steps, methods or process as the first embodiment, and thus are omitted to avoid repetition. In the second embodiment of the present invention, as illustrated in FIG. 12, in step 203, the gate dielectric layer 212 together with the dummy gate 208 may be removed to expose the substrate 202, so as to form an opening 220, as illustrated in FIG. 13. The dummy gate 208 and gate dielectric layer 212 may be removed by using wet etching and/or dry etching.

Figure 14:
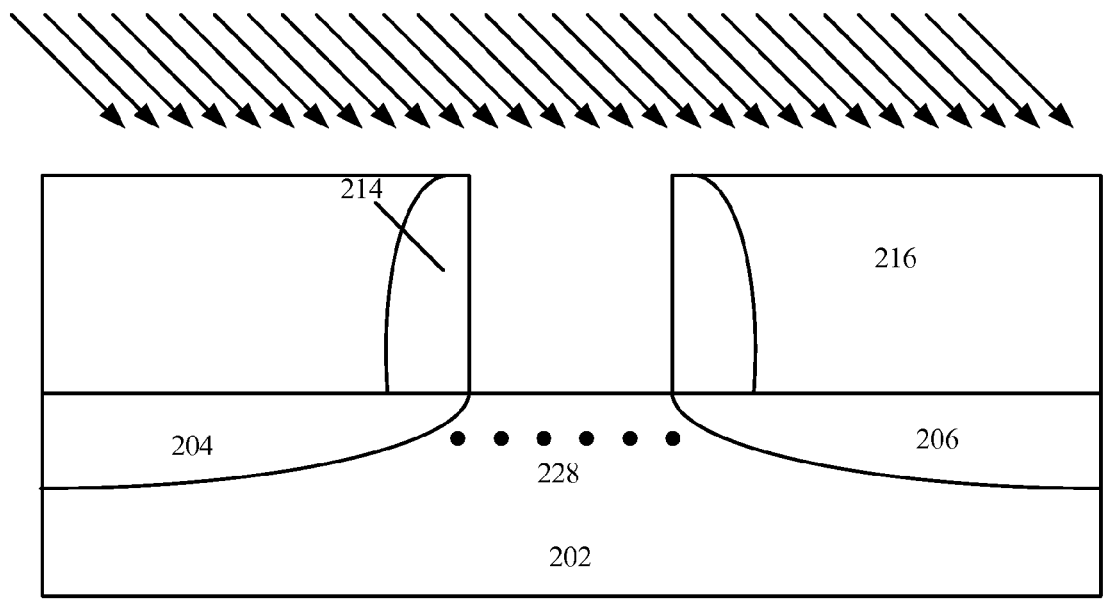
Figure 15:
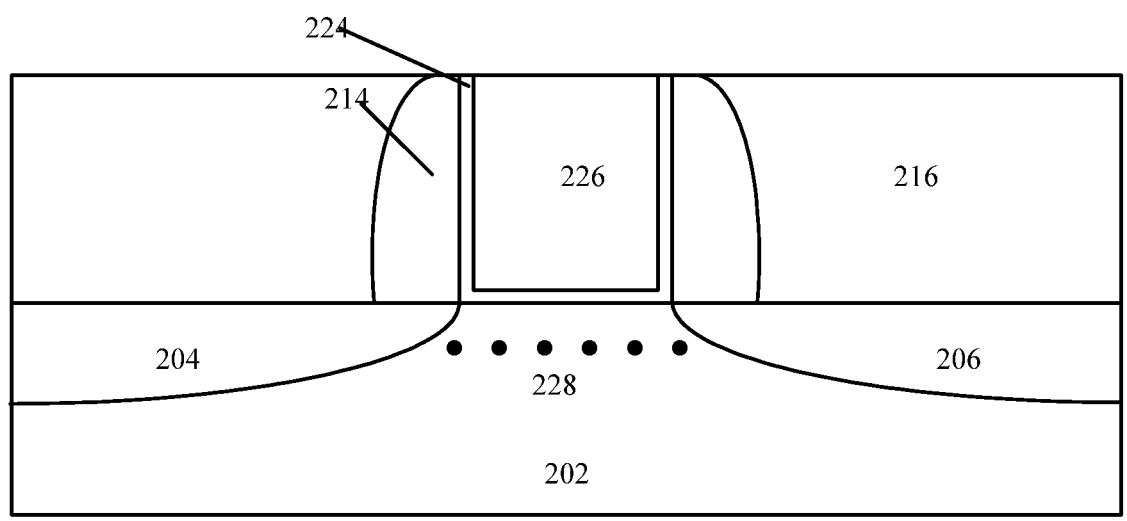

Then, similar to the steps in the first embodiment, in step 204, as illustrated in FIG. 14, the reverse Halo implantation is performed to the device, so as to form a reverse Halo implantation region 228 on the substrate via the opening. For an n-type semiconductor device, the n-type dopants implantation is performed, for example, by using Group-V elements, such as phosphorus and arsenic. The implantation energy is in the range of 5-40 keV, and the implantation dose is about 1e12-5e13. For a p-type semiconductor device, the p-type dopants implantation is performed, for example, by using Group-III elements, such as B, $BF_2$ and In. The implantation energy is in the range of 5-40 keV, and the implantation dose is about 1e12-5e13. Because the reverse Halo ions are implanted via the opening 220 in the present invention, the implantation energy required in the present invention is much lower than that in the prior art. In the present invention, two symmetric reverse Halo implantations may be performed to the device at an angle of about 0-40 degree to the vertical direction so as to form a reverse Halo implantation region 228 in the channel of the substrate. The reverse Halo implantation region is determined by the width of the opening 220, the height of the opening 220, the energy and angle of ion implantation and the ability of ions to penetrate through the sidewall spacers 214 and the dielectric layer 216. As the angle to the vertical direction increases, the reverse Halo implantation region will move from the middle of the channel to both sides of the channel, and the depth of the reverse Halo implantation region decreases as well. Therefore, the energy and angle of the reverse Halo ions are designed to control the short channel effects of the device in practice. Supposing that the two symmetric reverse Halo implantations are performed at a relative small angle to the vertical direction, the two reverse Halo implantation regions in the channel are so close to the middle of the channel to possibly overlap each other.

Since the size of the gate length determines the width of the opening 220, which in turn determines the amount of the implanted reverse Halo ion dopants, the amount of the implanted reverse Halo ion dopants decreases with the reduction of the gate length, and vice versa. Hence, the counteraction by the n-type reverse Halo ion dopants to the p-type dopants in the channel region in short channel nMOSFET is less than that in long channel nMOSFET, while the counteraction by the p-type reverse Halo ion dopants to the n-type dopants in the channel region in short channel pMOSFET is less than that in long channel pMOSFET. Therefore, the amount of the doped reverse Halo ions in the channel region of short channel MOSFET devices is less than that in long channel MOSFET devices. As a result, the threshold voltage of short channel devices may be increased to alleviate low threshold voltage effects caused by reduction of the gate length, and thereby control and alleviate the short channel effects.

Since the gate dielectric layer 212 has been removed in step 203, the flow directly goes to step 205, in which the device is annealed to activate the dopants in the reverse Halo implantation region. For example, rapid thermal annealing may be used, and other annealing processes may be used in other embodiments. If the dopants in the source/drain regions and the extensions have not been activated, this step may also be used for the purpose of annealing to activate the dopants. According to the embodiment of the present invention, spike annealing process is typically used to anneal the device, e.g., an annealing between 0.5 to 2 seconds at a temperature of above 1000° C.

Consequently, a new gate dielectric layer 224 and a metal gate 226 may be formed in the opening 222, wherein the gate dielectric layer 224 covers the interlayer dielectric layer 216, the portion of the substrate 202 in the opening 220, and the inner surfaces of sidewall spacers 214.

The method for forming a semiconductor device having a reverse Halo implantation region in a channel has been set forth above in accordance with the first and second embodiments, thereby alleviating the short channel effects without deteriorating the performance of the metal gate stack.

In the embodiments of the present invention, the reverse Halo implantation is performed via the opening formed by removing the dummy gate, to thereby alleviate the deterioration of the gate stack by the reverse Halo implantation region and avoid the gate leakage current. Furthermore, it also provides a method for performing reverse Halo implantation in a case of metal gate to reduce the overlapping between the reverse Halo implantation region and main parts of the source/drain regions, and thus may reduce the band-band leakage current in the MOSFET device.

Moreover, the reverse Halo implantation is performed on the channel region, that is, for the n-type semiconductor device, the n-type dopants implantation is performed, for example, by using Group-V elements, such as phosphorus and arsenic, and for the p-type semiconductor device, the p-type dopants implantation is performed, for example, by using Group-III elements, such as B, $BF_2$ and In, such that the doping amount of the reverse Halo ions in the channel region of MOSFET devices with a shorter gate length is much less than that in MOSFET devices with a longer gate length, to thereby improve the threshold voltage, control and alleviate the short channel effects.

Alternatively, regarding the reverse Halo implantation in the present invention, it is also possible for the reverse Halo dopants to be annealed after the annealing of the source/drain regions and their extensions and the reverse Halo ions implantation, to thereby avoid the impact of the annealing of the source/drain regions and their extensions on the reverse Halo dopants. Considering the impact on the dopants in the source/drain and their extensions, the reverse Halo implantation and annealing may be optimized separately, so as to meet the requirements for the activation and diffusion control of the reverse Halo dopants.

Moreover, because the reverse Halo implantation in the prior art is typically performed after the formation of the gate dielectric, the ion implantation may disadvantageously lead to deterioration of gate dielectric and performance degradation of the device. Whereas in the present invention, the reverse Halo implantation is performed before the formation of the gate dielectric and the metal gate, and thus the deterioration of the gate dielectric may be avoided.

Although the embodiments and their advantages have been described in detail, it is readily apparent to those having ordinary skill in the art that various alterations, substitutions and modifications may be made to the embodiments without departing from the spirit of the present invention and the scope as defined by the appended claims. For other examples, it may be easily recognized by a person of ordinary skill in the art that the order of the process steps may be changed without departing from the scope of the present invention.

In addition, the scope to which the present invention is applied is not limited to the process, mechanism, manufacture, material composition, means, methods and steps described in the specific embodiments in the specification. A person of ordinary skill in the art would readily appreciate from the disclosure of the present invention that the process, mechanism, manufacture, material composition, means, methods and steps currently existing or to be developed in future, which perform substantially the same functions or achieve substantially the same effects as that in the corresponding embodiments described in the present invention, may be applied according to the present invention. Therefore, it is intended that the scope of the appended claims of the present invention includes these process, mechanism, manufacture, material composition, means, methods or steps.

What claimed is:

1. A method of manufacturing a semiconductor device, the method comprising:
a) providing a substrate;
b) forming a source region, a drain region, a gate stack, sidewall spacers and an interlayer dielectric layer on the substrate, wherein the gate stack is disposed between the source region and the drain region on the substrate, the sidewall spacers are formed on the side surfaces of the gate stack, the interlayer dielectric layer covers the source region and the drain region, and the gate stack comprises a gate dielectric layer and a dummy gate;
c) removing the dummy gate to expose the gate dielectric layer, so as to form an opening;
d) performing reverse Halo implantation to the device to form a reverse Halo implantation region on the substrate via the opening, wherein for a n-type semiconductor device, the implantation dopants are n-type, and for a p-type semiconductor device, the implantation dopants are p-type ;
e) activating the dopants in the reverse Halo implantation region by annealing; and
f) performing subsequent device processing.

2. The method according to claim 1, wherein the step f) comprises: forming a metal gate in the opening.

3. The method according to claim 1, further comprising a step of removing the gate dielectric layer between steps d) and e) or after step e).

4. The method according to claim 3, wherein the step f) comprises: forming a new gate dielectric layer and a metal gate in the opening, wherein the new gate dielectric layer covers the inner surfaces of the sidewall spacers.

5. The method according to claim 1, wherein an annealing is performed before the step d), so as to activate the dopants in the source/drain regions.

6. The method according to claim 1, wherein the step d) comprises: for the n-type semiconductor device, the implantation is performed by using Group-V elements.

7. The method according to claim 6, wherein the Group-V elements include phosphorus and arsenic, the implantation energy is in the range of 5-40 keV, and the implantation dose is 1e12-5e13.

8. The method according to claim 1, wherein the step d) comprises: for the p-type semiconductor device, the implantation is performed by using Group-III elements.

9. The method according to claim 8, wherein the Group-III elements include B, BF2 and In, the implantation energy is in the range of 5-40 keV, and the implantation dose is 1e12-5e13.

10. The method according to claim 1, wherein the step of performing reverse Halo implantation comprises: performing two symmetric reverse Halo implantations to the device at an angle of about 0-40 degree to the vertical direction.

11. A method for manufacturing a semiconductor device, the method comprising:
a) providing a substrate;
b) forming a source region, a drain region, a gate stack, sidewall spacers and an interlayer dielectric layer on the substrate, wherein the gate stack is disposed between the source region and the drain region on the substrate, the sidewall spacers are formed on the side surfaces of the gate stack, the interlayer dielectric layer covers the source region and the drain region, and the gate stack comprises a gate dielectric layer and a dummy gate;
c) removing the gate dielectric layer and the dummy gate to expose the substrate, so as to form an opening;
d) performing reverse Halo implantation to the device to form a reverse Halo implantation region on the substrate via the opening, wherein for a n-type semiconductor device, the implantation dopants are n-type, and for a p-type semiconductor device, the implantation dopants are p-type ;

e) activating the dopants in the reverse Halo implantation region by annealing; and f) performing subsequent device processing.

12. The method according to claim 11, wherein the step f) comprises: forming a new gate dielectric layer and a metal gate in the opening, wherein the new gate dielectric layer covers the inner surfaces of the sidewall spacers.

13. The method according to claim 11, wherein an annealing is performed before the step d), so as to activate the dopants in the source/drain regions.

14. The method according to claim 11, wherein the step d) comprises: for the n-type semiconductor device, the implantation is performed by using Group-V elements.

15. The method according to claim 14, wherein the Group-V elements include phosphorus and arsenic, the implantation energy is in the range of 5-40 keV, and the implantation dose is 1e12-5e13.

16. The method according to claim 11, wherein the step d) comprises: for a p-type semiconductor device, the implantation is performed by using Group-III elements.

17. The method according to claim 16, wherein the Group-III elements include B, BF2 and In, the implantation energy is in the range of 5-40 keV, and the implantation dose is 1e12-5e13.

18. The method according to claim 11, wherein the step of performing reverse Halo implantation comprises: performing two symmetric reverse Halo implantations to the device at an angle of about 0-40 degree to the vertical direction.

\* \* \* \* \*